United States Patent [19]

Tyler

[11] 3,941,486
[45] Mar. 2, 1976

[54] WIRE BONDER
[75] Inventor: Arthur W. Tyler, Kowloon, Hong Kong
[73] Assignee: The Computervision Corporation, Bedford, Mass.
[22] Filed: June 3, 1974
[21] Appl. No.: 475,961

[52] U.S. Cl. .................... 356/172; 228/4.5; 228/9; 356/153; 356/168; 356/171
[51] Int. Cl.² ........................................ G01B 11/27
[58] Field of Search ........... 356/138, 153, 172, 168, 356/171; 29/589; 228/4, 56.5, 4.5, 9

[56] References Cited
UNITED STATES PATENTS

| | | | |
|---|---|---|---|
| 3,237,194 | 2/1966 | Curry et al. | 356/172 |
| 3,615,138 | 10/1971 | Pedrotti et al. | 356/153 |
| 3,679,316 | 7/1972 | Boujon | 356/172 |
| 3,728,027 | 4/1973 | Watanabe | 356/172 |
| 3,737,238 | 6/1973 | Reiner et al. | 356/172 |
| 3,817,626 | 6/1974 | Lirtar | 356/172 |

*Primary Examiner*—John K. Corbin
*Assistant Examiner*—Wm. H. Punter
*Attorney, Agent, or Firm*—Richard J. Birch

[57] ABSTRACT

A thermocompression, tailless wire bonder which permits the bonding operation to take place at any location along the path of the bonding tool without affecting the length of wire protruding below the bonding tool or the location of the end of the wire relative to the torch. A non-frictional wire tensioning device is employed to produce a constant and adjustable tension on the bonding wire. A virtual image, parallax free, optical positioning system is utilized to position the bonding tool.

11 Claims, 13 Drawing Figures

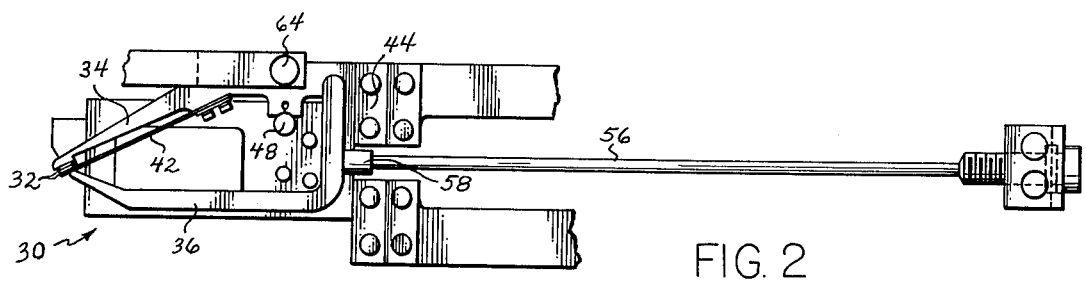
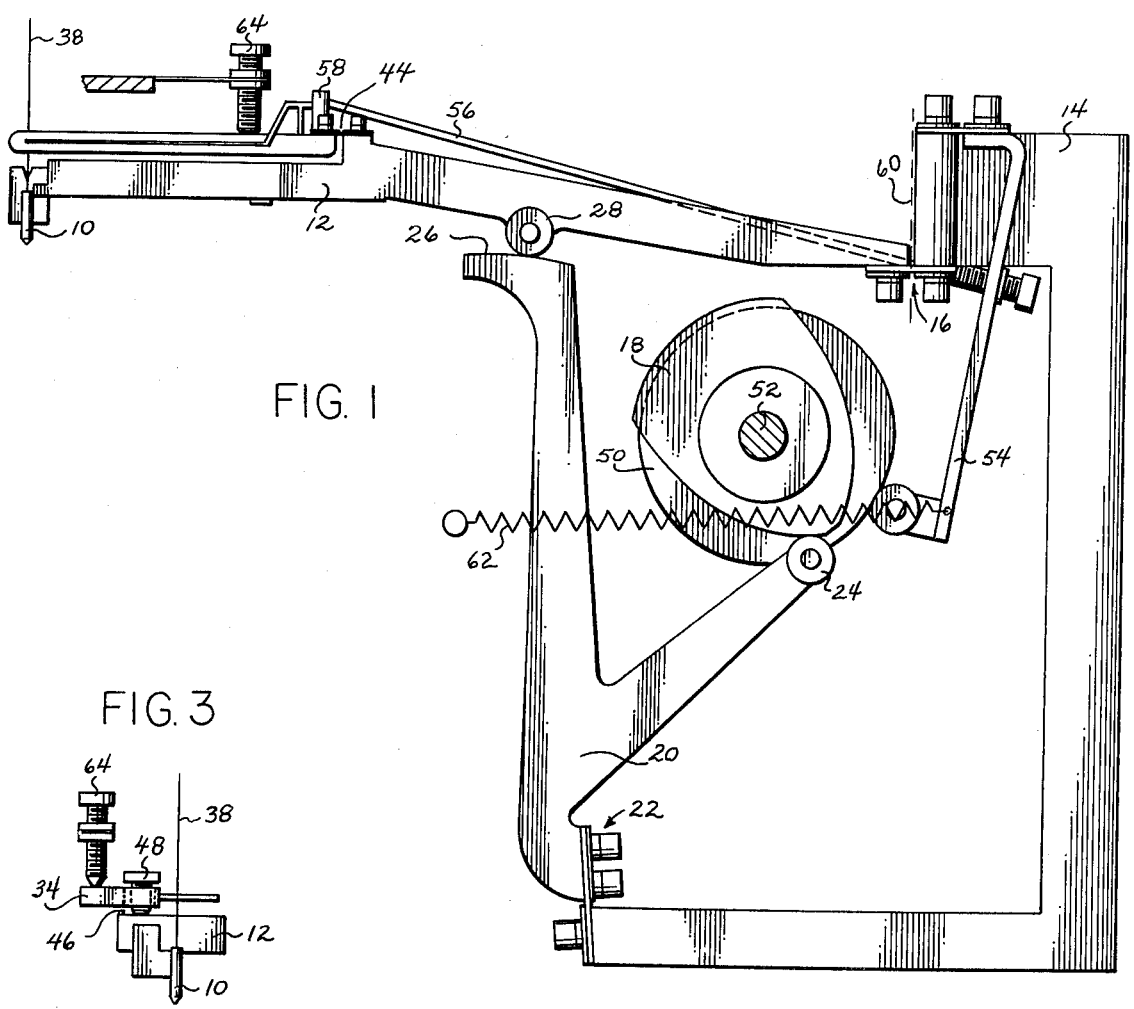
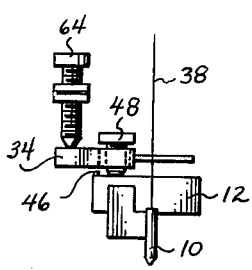
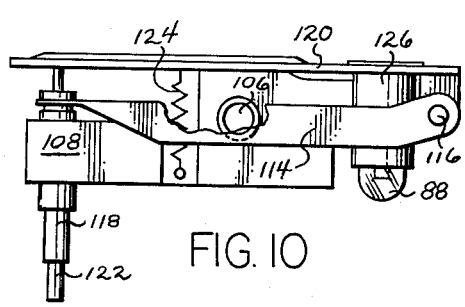
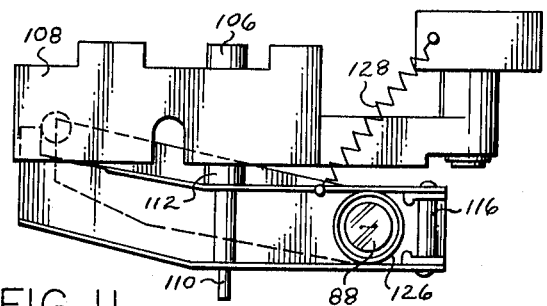

3,941,486

WIRE BONDER

BACKGROUND OF THE INVENTION

The present invention relates to wire bonders in general and, more particularly, to tailless wire bonders.

Heretofore, tailless wire bonders have suffered from various deficiencies limiting their performance or requiring complex and costly mechanisms to circumvent the problems. One such machine which is described in U.S. Pat. No. 3,643,321, overcomes some of the problems encountered in earlier machines by a mechanism which clamps the wire during the second bond, raises the bonding tool a predetermined distance while the clamping device remains stationary, and then raises both the bonding tool and the clamping device together to break the wire at the bond leaving a tailless bond and a predetermined length of wire protruding below the bonding tool. Subsequently the bonding tool & clamping device rise to a fixed position and a torch is moved close to the protruding wire to melt the end of the wire forming a small spherical ball.

It is most important to the subsequent bonding step that this ball is consistent in size. An important factor in controlling the ball size is the length of wire protruding below the bonding tool and the location of the end of the wire relative to the position of the torch. Precise control of these variables in the referenced machine requires that the final bonding operation take place at a fixed and predetermined position along the path of motion of the bonding tool. A machine adjustment must be provided for this purpose and extreme care must be taken to hold the workpiece at the correct position.

The present invention provides a means for achieving a tailless final bond whereby the bonding operation may take place at any location along the path of the bonding tool without affecting the length of wire protruding below the bonding tool or the location of the end of the wire relative to the torch. A substantial simplification in the workholder results from this improvement. A further advantage of the invention is that the length of wire protruding below the bonding tool is determined by only one (adjustable) member, rather than several cams and linkages, whereby a precise wire length can be achieved without requiring many precision parts.

Thermocompression wire bonders generally use some means of providing a controlled amount of drag or tension in the wire feeding into the bonding tool in order to control the size and shape of the wire loop between the first and final bonds. Some machines use a simple friction pad squeezing the wire. Others use a combination of a friction pad and a spring to maintain tension in the wire in case the bonding tool is moved in a backwards direction tending to shorten the wire. It is desireable to maintain constant tension in the wire during formation of the loop regardless of the motion of the bonding tool and to be able to adjust the tension conveniently to the desired amount.

Devices employing friction are notoriously variable in their characteristics and generally unreliable for producing small, precise forces. Furthermore, spring devices heretofore used are unable to provide an adjustable force that then remains constant over a reasonably large deflection. The present invention overcomes both of these difficulties providing a constant and adjustable tension without the use of frictional devices.

Wire bonders used in the semiconductor industry generally use manual positioning by an operator of the workpiece relative to the bonding tool. The machines are provided with various devices to assist the operator such as a micropositioner, a viewing stereo microscope and in some cases an optical device, (such as shown in U.S. Pat. No. 3,661,316) projecting a spot of light onto the workpiece at the location where the bonding tool will make contact. The optical spot projector suffers from the defects of parallax error since the projected beam of light must be several degrees from vertical, low spot brightness, a rather large, bulky structure and a shimmering instability of the spot position caused by the heated air rising from the workpiece. The present invention provides an optical positioning aid of comparable effectiveness but free of all of these deficiencies.

It is a general object of the present invention to provide an improved tailless wire bonder.

It is a specific object of the invention to provide a tailless, thermocompression wire bonder which permits wire bonding at any location along the path of the bonding tool.

It is another specific object of the invention to provide a tensioning device for thermocompression wire bonders which produces a constant and adjustable tension without utilizing frictional means.

It is still another object of the invention to provide an improved optical positioning apparatus for wire bonders.

These objects and other objects and features of the invention will best be understood from a detailed description of a preferred embodiment thereof, selected for purposes of illustration and shown in the accompanying drawings, in which:

FIG. 1 is a view in side elevation of the wire bonder bonding tool and wire clamping device of the present invention;

FIG. 2 is a plan view of the device illustrated in FIG. 1;

FIGS. 3A through 3D diagrammatically illustrates the sequential operation of the tailless bonder.

Figure 5:
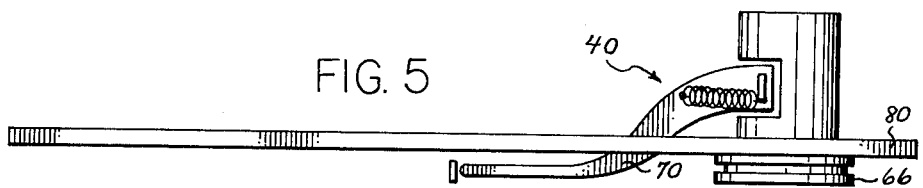
Figure 4:
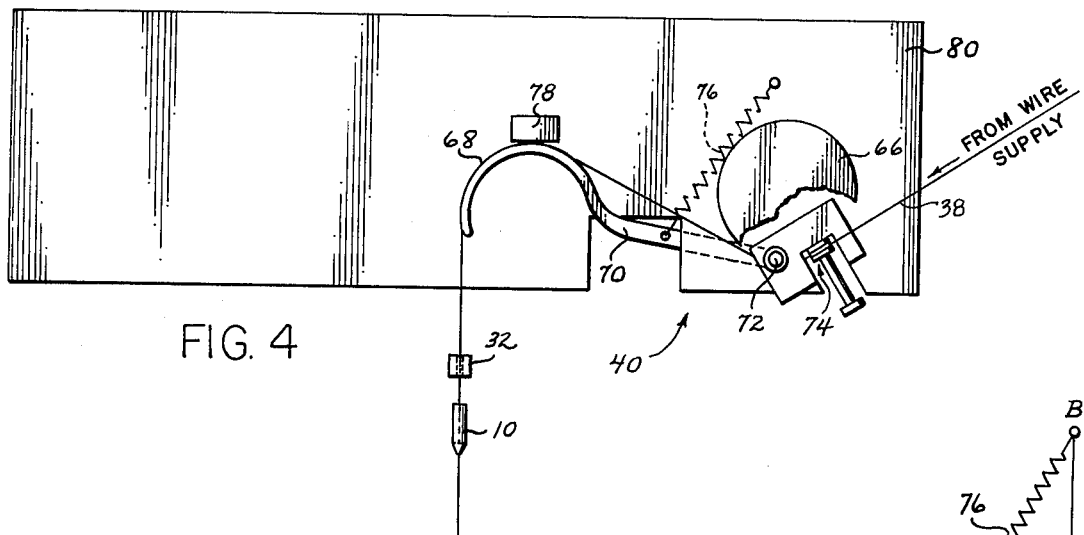
Figure 6:
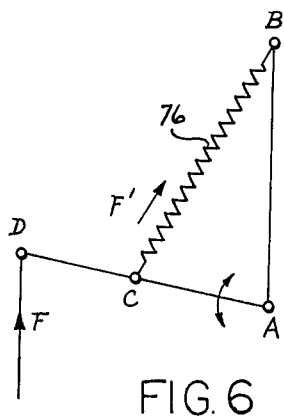
Figure 7:
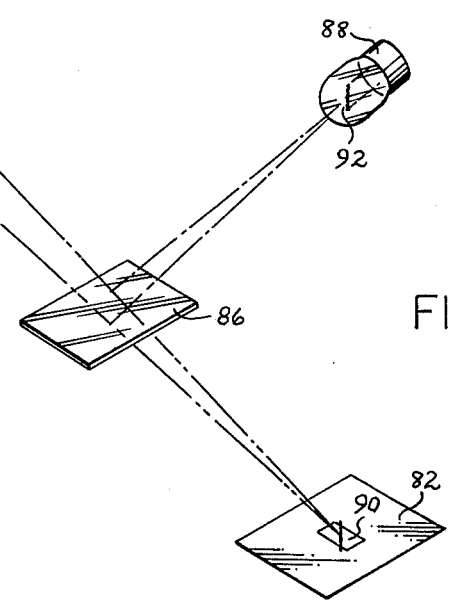
Figure 8:
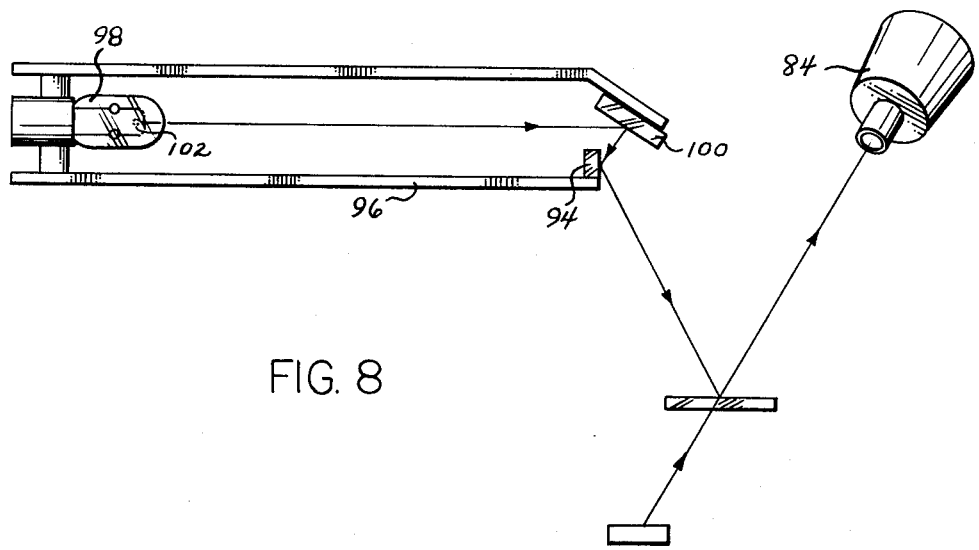
Figure 9:
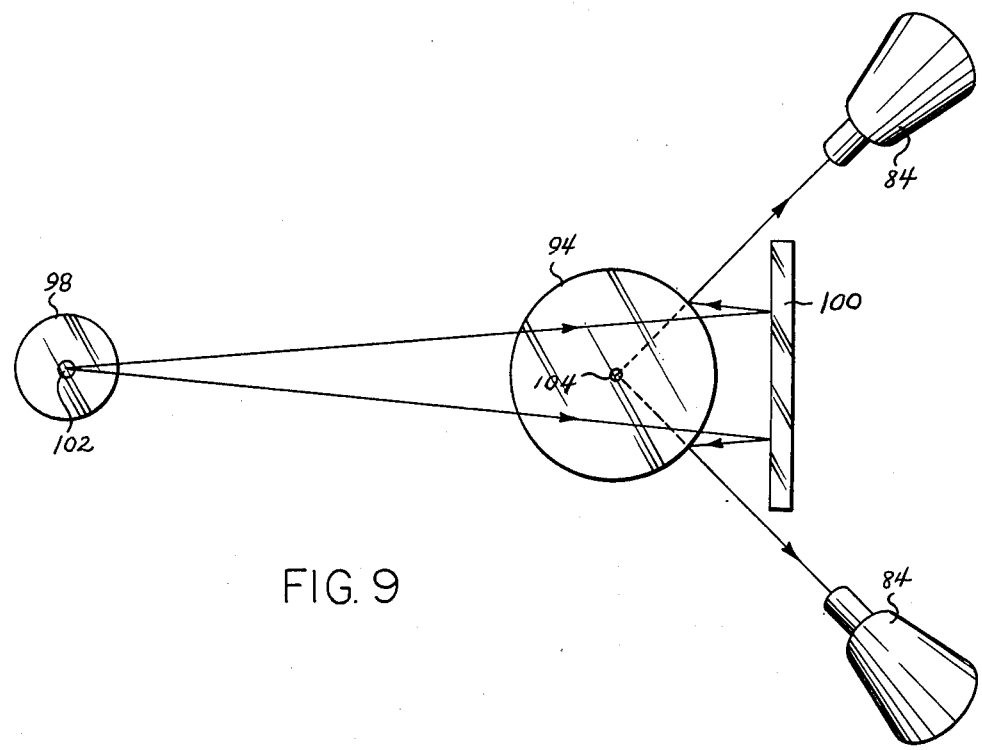

FIG. 4 is a view in side elevation of the wire tensioning device of the present invention;

FIG. 5 is a plan view of the wire tensioning device of FIG. 4;

FIG. 6 is a diagrammatic view illustrating the force relationships of the wire tensioning device;

FIG. 7 is a diagrammatic view in perspective of the optical positioning device of the present invention;

FIG. 8 is an alternative version of the optical positioning device which employs a circular, cylindrical mirror;

FIG. 9 is a greatly enlarged projected view of the light path through the device of FIG. 8 reviewed from a direction paralled to the axis of the cylinder;

FIGS. 10 and 11 illustrate in plan and side elevational views respectively, the preferred mounting system for the light source.

Turning now to the drawings, FIG. 1 shows a preferred embodiment of the invention. A bonding tool 10 is mounted at one end of bonding arm 12 which is pivotally mounted at the other end to the frame of the machine 14 by means of a leaf spring bearing 16. The bonding tool 10 may be moved along substantially a vertical, linear path by a rotation of arm 12 through a small angle. The position of arm 12 is controlled by a motor driven cam 18 and linkage comprising a lever 20 pivotally mounted by bearing 22. One end of lever 20 has a roller 24 in contact with motor driven cam 18 which causes lever 20 to oscillate forward and backward in a precise manner. The other end of lever 20 has a cam shaped surface 26 in contact with roller 28 mounted on arm 12. The shapes of cam 18 and 26 are designed to provide the most suitable motion of the bonding tool.

A wire clamp, indicated generally as 30, comprises two clamping pads 32, rigid arm 34 and movable clamping arm 36 mounted directly above bonding tool 10 such that the bonding wire 38 coming from a suitable wire supply (not shown) passes between the clamping pads and through the axial hole in the bonding tool. The wire is urged upward by a tensioning device (indicated generally as 40 in FIGS. 4 and 5) but it is restrained from moving either by the ball shaped end of the wire pressing against the tip of the bonding tool, by the wire clamp or by a bond to the workpiece. One clamping pad is mounted on rigid arm 34 and the other is mounted on a flexible member 42 attached to arm 34. The moveable clamping arm 36 is pivotally mounted with respect to arm 34 and it applies pressure to flexible member 42 to squeeze the clamping pads together when the wire is to be clamped.

The wire clamp 30 is pivotally mounted on the bonding arm 12 by means of leaf spring bearing 44 attached to the rigid arm 34. The motion of arm 34 is restrained in a downward direction by a fixed stop 46 and in the upward direction by an adjustable stop 48 both mounted on bonding arm 12. The motion of arm 34 causes the wire clamping pads 32 to move substantially in a vertical direction along the extended axis of the bonding tool 10. Normally arm 34 is urged upward against adjustable stop 48 with a preset force by the reaction of leaf spring bearing 44. As will be explained subsequently, the length of wire protruding from the bonding tool is exactly equal to the movement of the wire clamping pads as arm 34 moves from the adjustable stop 48 to the fixed stop 44, independent of all other machine parameters.

The wire clamp 30 is actuated by a cam and linkage comprising a second motor driven cam 50 mounted on the main cam shaft 52 and accurately phased relative to cam 18, a pivotally mounted cam follower arm 54 in contact with cam 50, a push rod 56 moved by cam follower arm 54 and a coupling link 58 between push rod 56 and movable clamping arm 36. Push rod 56 passes through the bonding arm bearing axis 60 so that the clamping force transmitted along push rod 56 from cam follower 54 exerts substantially no torque on bonding arm 12. Thus the forces, motion and timing of the bonding arm mechanism and of the wire clamp mechanism are substantially independent of each other.

The force transmitted by the push rod through coupling link 58 to the movable clamping arm 36 causes the arm to move slightly and apply pressure to the clamping pads 32. However, the point of application of the force to the movable clamping arm 36 is a short distance above the axis of the leaf spring bearing 44. After the clamping pads close the continued motion of the push rod causes the wire clamp assembly to move downward from the adjustable stop 48 to the fixed stop 46. Since the push rod can now move no further, the cam follower arm 54 lifts free of the cam 50 allowing the force of spring 62 to apply a fixed force to the clamping pads.

The action of the wire clamp mechanism to form a tailless final bond and leave a constant length of wire protruding from the tip of the bonding tool can now be described. The machine is normally in the "reset" condition with the bonding arm raised to its maximum position and the wire clamp closed. The operator moves the workholder to bring the first bond location directly below the bonding tool and depresses the bond pushbutton. The drive motor turns the camshaft through a fixed angle causing the bonding arm to be lowered to its minimum position and raised again to the "loop" position.

The wire clamp is opened by the action of cam 50 at the beginning of the descent of the bonding arm and held open until later in the complete cycle. The bonding tool may make contact with the workpiece at any location along its descent path but the workpiece is usually located near the bottom of the descent path. The shape of cam 50 is such that the bonding arm is descending at a constant velocity during the final 10% of its travel in order to produce a constant impact force when the bonding tool strikes the workpiece for any position of the workpiece within that region.

After the machine has stopped in the loop position, the operator positions the workpiece for the final bond and releases the bond pushbutton. The drive motor turns the cam shaft 52 through another fixed angle causing the bonding arm to be lowered again to its minimum position and raised to the reset position. The wire clamp is closed (FIG. 3A) and depressed relative to the bonding arm (FIG. 3B) by the action of cam 50 as previously described when the bonding arm reaches the minimum position and the wire clamp is held in that position for the duration of the cycle. The bonding tool will make contact with the workpiece and stop the descent of the bonding arm at some position above the minimum position. This bonding position is usually located near the minimum position for the reason previously described but it may be located at any position along the descent path.

Figure 3D:
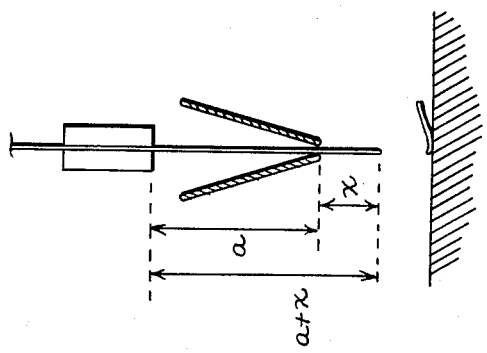
FIG. 3 is an end-on view of the device of FIG. 1 showing the stop mechanisms for the bonding tool.
Figure 3C:
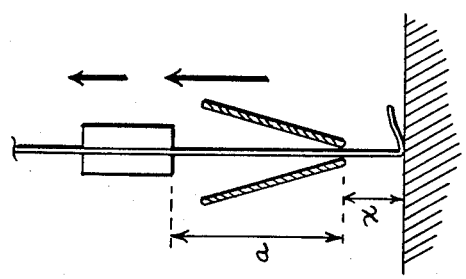
Figure 3B:
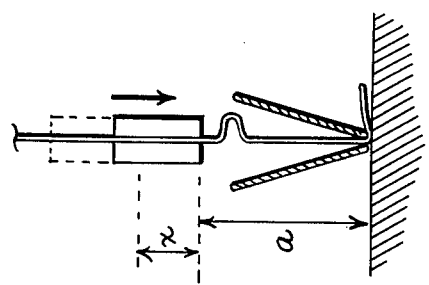
Figure 3A:
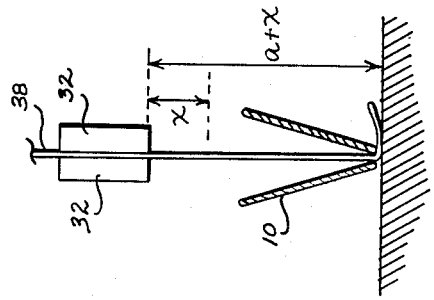

The wire is normally stretched straight above the bonding tool by the tensioning device. When the wire clamp 30 is closed and moved downward relative to the bonding arm by cam 50 the wire between the clamp and the bonding tool 10 deflects sideways forming a small slack loop (FIG. 3B). When the bonding arm 12 ascends to the reset position, the wire clamp remains closed and depressed relative to the bonding arm and the wire between the clamp and the final bond is stretched straight again (FIG. 35) and then broken at the final bond (FIG. 3D). The method of causing the wire to break at the final bond rather than elsewhere along its length is well known in the art. The excess length of wire forming the slack loop between the wire clamp and the bonding tool, which is exactly equal to the downward movement of the wire clamp relative to the bonding arm, is pulled through the bonding tool just before the wire is broken and remains as the tail protruding below the tip of the bonding tool.

When the bonding arm reaches the reset position, which is a fixed location relative to the frame of the machine, a torch (not shown) is caused to move close to the end of the wire protruding from the bonding tool melting the wire to form a small ball on the end of the wire.

When the wire clamp push rod moves backwards to release the clamp it first would allow the clamp mechanism to move upwards relative to the bonding arm before opening the clamp. This motion might break the wire when the ball comes in contact with the tip of the bonding tool. In order to prevent wire breakage a flexible stop 64 is attached to the machine frame to hold the wire clamp mechanism in the depressed position while the bonding arm is in the reset position until the wire clamp opens.

The preferred embodiment of the wire tensioning device of the present invention is illustrated in FIGS. 4 and 5. The wire 38 from a suitable wire supply (not shown) passes partially around a circular drum 66, then around the circular channel 68 attached to the end of tension arm 70 and directly downward between the wire clamping pads 32 to the bonding tool 10. Tension arm 70 is pivotally mounted by bearing 72, located behind drum 66 such that the extended bearing axis passes through the cirumference of drum 66. A second wire clamp 74, located between the wire supply and drum 66 is normally closed to prevent the wire from sliding around the drum. A spring 76 urges the tension arm upwards in a manner to be described to produce a constant tension in the wire.

Bonding tool 10 and wire clamps 32 are mounted on the bonding arm which moves downward and then upward in a vertical direction when a bond is to be made. The tension arm 70 is pulled by the wire to follow the motion of the bonding arm and to supply wire for the loop as it is needed, always maintaining constant tension in the wire. It is advantageous to construct the tension arm to have a minimum amount of inertia about its axis of rotation in order to minimize the force due to acceleration of the tension arm.

As wire is consumed in making bonds the tension arm 70 acquires a permanent downward displacement superimposed on the oscillatory motion caused by the movement of the bonding arm. The mechanism is designed to provide sufficient movement of the tension arm to make several bonds before restoring the tension arm to its original position. However, the preferred form of the invention restores the tension arm when the bonding arm returns to its normal (reset) position after each final bond. A linkage from the torch mechanism (not shown) momentarily opens clamp 74 allowing the tension force to pull additional wire from the wire supply until the tension arm is restrained from further upward motion by a fixed stop 78.

The tensioning device is designed to provide a range of motion of the tension arm 75 equally upwards and downwards from a horizontal position. Furthermore, when the tension arm is horizontal the wire touches the drum 66 tangentially at the location of the extended axis of the tension arm. It can readily be seen that with this design the wire wraps and unwraps from the drum without sliding on the drum and with substantially no sliding on circular channel 68 for small angular displacements of the tension arm from horizontal, preferably less than 15°. Thus it can be seen that substantially no frictional forces are present during the bonding and looping portion of the machine cycle. Certainly any residual frictional forces are negligible compared to the tension force produced by the spring.

FIG. 6 is a diagram further explaining the action of the spring 76 to produce constant tension. One end of the spring is pivotally attached to the tension arm 70 at point C. The other end is pivotally attached to the supporting frame 80 at point B which is directly above the tension arm bearing 72 located at point A on the supporting frame. The wire is in effect attached to the tension arm at point D and extending directly downward substantially parallel to the line $\overline{AB}$. The spring is designed to generate a force F′ proportional to the distance $\overline{BC}$ between the two points of attachement, i.e. $F' = K \times \overline{BC}$. It can easily be proven by a simple geometric analysis of the forces in the mechanism that the force F produced at point D in a direction parallel to $\overline{AB}$ is equal to $$F = \frac{\overline{AC}}{\overline{AD}} \times K \times \overline{AB}$$

i.e., the force F is completely independent of the angular position of the tension arm as it rotates about its axis and hence is constant for all angular positions. Furthermore, the force F is proportional to the distance $\overline{AB}$, the distance of the stationary supporting point of the spring above the tension arm axis, consequently the wire tension can be adjusted conveniently over a reasonable working range by moving the stationary supporting point of the spring along line $\overline{AB}$ and its extension.

The diagrammatic perspective of FIG. 7 illustrates the principle of the optical positioning system of the present invention. A workpiece 82 is observed through a stereo microscope 84 at some convenient viewing angle through a semitransparent mirror 86. A miniature incandescent lamp 88 is located relative to the mirror such that a virtual image 90 of the lamp filament 92 is observed by reflection from the mirror superimposed on the workpiece at the precise location where the bonding tool will touch the workpiece.

The lamp filament can be constructed to have any shape suitable for judging the relative location of the filament image and the desired bonding position to enable the operator to move the workpiece to bring the bonding position into coincidence with the filament image and hence in the path of the bonding tool. It has been found convenient and preferable to construct the lamp filament from a straight piece of tungsten wire approximately 0.001 inch in diameter and 0.150 inch long. When an electric current is passed through the filament it becomes incandescent over a portion of its length midway between the supporting leads. The virtual image of the filament thus appears as a short, straight, narrow line of light. The location and orientation of the mirror and lamp are adjusted to produce a virtual filament image perpendicular to and intersecting the plane of the workpiece at the precise point where the bonding tool will touch the workpiece. Many suitable locations and orientations of the mirror and lamp are possible. It is convenient to locate the lamp directly above the workpiece with the lamp filament collinear with the bonding tool axis and the mirror in a horizontal plane.

An alternative form of light source to substitute for the incandescent lamp 88 and capable of producing a virtual line image having more precisely controlled dimensions is illustrated in FIGS. 8 and 9. A highly polished mirror in the form of a short, small diameter, circular cylinder 94 is mounted on a suitable support 96 such that the cylinder axis is approximately in the same location as lamp filament 92. Light from a small coiled filament lamp 98 is directed against cylinder 94 by a mirror 100 and reflected from the cylinder and semitransparent mirror 86 into stereo microscope 84 as before. FIG. 9 is a greatly enlarged projected view of the path of the light through the system viewed from a direction parallel to the axis of cylinder 94.

The virtual image of lamp filament 102 appears as a long narrow line 104 within the cylinder parallel to the cylinder axis. The diameter of the line image 104 appears as a greatly reduced image of the diameter of coiled filament 102 formed by the convex mirror surface of cylinder 94 hence the diameter may be adjusted in size by a suitable choice of filament size, cylinder diameter and lamp distance. The length of the line image 104 can be controlled by painting or otherwise covering the mirror surface of cylinder 94. In particular the line image can take the form of one or more short, collinear segments separated by a convenient distance in order to assist the operator further in judging the relative position of the image and the workpiece.

The lamp 88 or alternative light source must be mounted firmly but adjustably to the machine frame to enable the operator to make fine adjustments in lamp position. FIGS. 10 and 11 illustrate the preferred form of the lamp adjustable mounting. A vertical screw 106 threaded into a fixed support 108 has a concentric bearing shaft 110 extending above a shoulder 112. Arm 114, which is rotatably mounted on shaft 110, has a vertical bearing 116 near one end and bears against the end of an outer adjusting screw 118. A second arm 120 rotatably mounted on bearing 116 bears against the end of an inner concentric adjusting screw 122. Spring 124 attached to arm 120 urges both arm 120 and arm 114 firmly against the ends of the adjusting screws. Lamp 88 is adjustably mounted in a sleeve 126 attached to arm 120. A second spring 128 attached to arm 120 urges the arm and arm 114 firmly upward against shoulder 112 and laterally against bearings 110 and 116 to prevent undesireable movement due to any residual looseness in said bearings.

A rotation of screw 106 will raise or lower arm 114 and hence lamp 88 which causes the virtual filament image 90 (see FIG. 7) to move downwards or upwards perpendicular to the workpiece. This "focus" adjustment selects that portion of the filament image which is most convenient for the operator to be in sharp focus at the plane of the workpiece. A rotation of concentric adjusting screws 118 and 122 causes the lamp to move in a horizontal plane. The location of bearings 110 and 116 relative to lamp filament 92 is such that the motion of filament produced by adjusting screw 118 is substantially perpendicular to the motion produced by adjusting screw 122 over the small adjusting range required. These "position" fine adjustments are used by the operator to move the lamp and hence the virtual filament image parallel to the plane of the workpiece to place the image precisely at the point of contact.

Since the virtual image 90 is substantially a straight line perpendicular to the workpiece which straight line is also the descent path of the bonding tool, the image is a precise indicator of the bonding position free from parallax error for any vertical displacements of the workpiece surface.

The brightness of the lamp filament can be adjusted throughout a very wide range. Even though the light intensity is reduced by the reflectivity of mirror 86, preferably in the range of 5–10%, the filament brightness can easily be adjusted to any practical level or even increased beyond a level that the eye can tolerate since the filament is viewed directly through the microscope.

Having described in detail a preferred embodiment of my invention, it will now be apparent to those skilled in the art that numerous modifications can be made therein without departing from the scope of the invention as defined in the following claims.

What I claim and desire to secure by Letters Patent of the United States is:

1. An optical positioning apparatus for a tool which is movable along a path with respect to the surface of a workpiece, said optical positioning system comprising: means for generating a virtual image of a straight line reference pattern superimposed on the surface of the workpiece, said virtual image being perpendicular to the surface of the workpiece; and, means for maintaining a predetermined physical relationship between the movement path of the tool and the virtual image generated by said image generating means.

2. The apparatus of claim 1 wherein said straight line reference pattern is a light generating incandescent lamp filament.

3. The apparatus of claim 1 wherein said virtual image generating means includes a cylindrical mirror and wherein said reference pattern straight line is a virtual image of a light generating incandescent lamp filament formed by said cylindrical mirror.

4. The apparatus of claim 3 wherein said straight line reference pattern includes a reference point along its length.

5. The apparatus of claim 4 wherein said reference point comprises an interrupted segment in said line.

6. The apparatus of claim 1 wherein said straight line is a light generating means.

7. The apparatus of claim 1 wherein said virtual image has a uniform cross-section.

8. The apparatus of claim 1 wherein said reference pattern produces a virtual image which has a uniform cross-section for intersecting planes parallel to a planar workpiece surface whereby the reference pattern is free of parallax error for a plurality of parallel workpiece surfaces.

9. The apparatus of claim 6 wherein said straight line reference pattern includes a reference point along its length.

10. The apparatus of claim 9 wherein said reference point comprises an interrupted segment in said line.

11. The apparatus of claim 10 wherein said interrupted segment is the sufficient length that the virtual image of the reference pattern appears as two spaced illuminated dots.

* * * * *